(12) United States Patent
Lee et al.

(10) Patent No.: US 6,291,308 B1
(45) Date of Patent: Sep. 18, 2001

(54) MASK ROM FABRICATION METHOD

(75) Inventors: Woon-kyung Lee, Suwon; He-jueng Lee, Cheonan, both of (KR)

(73) Assignee: Samsung Electronics Co., Ltd. (JP)

( * ) Notice: Subject to any disclaimer, the term of this patent is extended or adjusted under 35 U.S.C. 154(b) by 0 days.

(21) Appl. No.: 09/372,850

(22) Filed: Aug. 12, 1999

(30) Foreign Application Priority Data

Aug. 14, 1998 (KR) .................................................. 98-33069

(51) Int. Cl.[7] .................................................. H01L 21/76
(52) U.S. Cl. .......................................... 438/400; 438/587
(58) Field of Search .................................... 438/269, 587, 438/592, 275, 276, 277, 278, 279, 702, 400; 257/324, 326; 365/104, 182

(56) References Cited

U.S. PATENT DOCUMENTS 5,324,680 * 6/1994 Lee et al. ................................. 437/52
5,470,774 * 11/1995 Kunitou .................................. 437/45
5,920,784 * 7/1999 Lee ........................................ 438/307

* cited by examiner

*Primary Examiner*—David Nelms
*Assistant Examiner*—David Vu
(74) *Attorney, Agent, or Firm*—Cantor Colburn LLP

(57) ABSTRACT

A method for fabricating a mask ROM capable of effectively reducing the distance of buried impurity diffusion regions. The method includes stacking a pad oxide layer and a first anti-oxidation layer in sequence in a cell array region and a peripheral circuit region of a semiconductor substrate. The anti-oxidation layer is partially etched to form a first pattern defining an isolation region of the peripheral circuit region and a second pattern defining a buried impurity diffusion region of the cell array region, and a second anti-oxidation layer is stacked, and then the second anti-oxidation layer stacked in the peripheral circuit region is removed, so that the second anti-oxidation layer stacked in the cell array region remains. Then, a field oxide layer is formed in the isolation region of the peripheral circuit region, exposed by the remaining second anti-oxidation layer; and impurities are implanted to form the buried impurity diffusion region.

17 Claims, 8 Drawing Sheets

MASK ROM FABRICATION METHOD

BACKGROUND OF THE INVENTION

1. Field of the Invention

The present invention relates to a method for fabricating a semiconductor device, and more particularly, to a method for fabricating a mask ROM capable of effectively reducing the distance between buried impurity diffusion regions.

2. Description of the Related Art

As the level of integration of semiconductor devices increases, the scaling-down of a pattern pitch, that is, decreasing the line width of a circuit, becomes a center of interest. Such a decrease in line width of a circuit is achieved by developing photolithography technology. The line width of the circuit is determined by various factors, e.g., resolution of a photoresist used for manufacturing a pattern or wavelength of light (the shorter wavelength is favorable for a small pattern). Decreasing the line width of circuits, that is, decreasing the pitch, is very important to more highly integrated semiconductor devices, and is a trend which is likely to become more emphasized in the future.

As mentioned above, a semiconductor device can be reduced by decreasing a wavelength of light which is one of the important factors that determine the resolution of a photoresist used for a photolithography process. The light used for photolithography has been changed from g-line having a wavelength of 426 nm, used initially, to I-line having a wavelength of 265 nm used at the present. Also, a KrF excimer laser of 248 nm will be used in the future as a light source for photolithography. Also, the resolution increases such that an aperture of an exposure device used during the photolithography is enlarged and the wavelength of light decreases.

However, if the size of a semiconductor device is reduced by the above-mentioned method, investment costs for equipment capable of producing a new generation semiconductor device increase logarithmically. Such a high-cost investment according to the high integration of a semiconductor device in addition to the shortened life cycle of a product becomes a burden to a manufacturer. Thus, much attention has been devoted to a method capable of increasing the degree of integration of a device as well as of minimizing investment costs.

FIG. 1 is a plan view of a cell array region of an NOR type mask ROM, and FIGS. 2A through 2D are sectional views cut along lines a–a', b–b', c–c' and d–d' of FIG. 1.

In FIG. 1, reference character P1 represents a buried impurity diffusion region, reference character P2 represents a word line (that is, gate electrode), reference character P3 represents a metal interconnection, and reference character P4 represents a mask pattern for controlling a threshold voltage of a channel region (that is, for programming).

The buried impurity diffusion regions P1 are separated by a predetermined distance, parallel to each other. The word lines P2 are perpendicular with respect to the buried impurity diffusion regions P1, and separated by a predetermined distance like the buried impurity diffusion regions P1. The metal interconnections P3 are arranged parallel to the buried impurity diffusion regions P1. The mask patterns P4 for controlling a threshold voltage of a channel region are arranged in a channel region of a designated cell requiring programming. The buried impurity diffusion regions serve as a source/drain of a cell transistor and a bit line.

Referring to FIG. 1, each cell is formed along the word line, and a portion where the buried impurity diffusion region overlaps with the word line becomes a source/drain, and a lower portion of the word line which does not overlap the buried impurity diffusion region becomes a channel region.

In FIGS. 2A through 2D, reference numeral 10 represents a semiconductor substrate, reference numeral 12 represents a buried impurity diffusion region, reference numeral 14 represents a gate oxide layer, reference numeral 16 represents a word line (i.e., gate electrode), reference numeral 18 represents an insulation layer for preventing the gate electrode, reference numeral 20 represents an interlayer dielectric (ILD) film, reference numeral 22 represents a metal interconnection, and reference numeral 24 represents an insulation layer for preventing the metal connection. in FIG. 2A, a region marked with "+" represents a designated channel region which requires programming and impurities are implanted into this region to control a threshold voltage.

The buried impurity diffusion region 12 overlapped with the word line 16 becomes a source/drain of each cell, and a lower region of the word line 16 located between the buried impurity diffusion regions 12 becomes a channel region.

The operation of a cell of a NOR type mask ROM will now be described. A voltage of 0~2V is applied to a bit line connected to a specified cell from which a programed data is read, and neighboring bit lines are grounded, and a high voltage is applied to a word line of the specified cell. Here, if the threshold voltage of a channel region of the specified cell is programed to be higher than the highest voltage, the specified cell is turned off when it is read as being in an "off" state, so that discharging of the bit line is prevented. If the threshold voltage of the channel region of the specified cell is programmed to be lower than the high voltage, the specified cell is turned on when it is read as being in an an "on" state. Each bit line is connected to a source of a select transistor (not shown) formed at the edge of each buried impurity diffusion region, and voltage is supplied to the buried impurity diffusion region by the operation of the select transistor.

In general, a cell is programed into two states according to whether the threshold voltage of the channel region of each cell is higher or lower than the voltage supplied to the gate electrode of each cell. Here, the threshold voltage of the channel region of each cell is controlled using the mask pattern P4 shown in FIG. 1.

Also, in order to increase the degree of integration of the mentioned mask ROM, it is important to reduce the area occupied by the cells therein. In the most favorable method for integration, referring to FIG. 1, the pitch of the buried impurity diffusion region P1 (see FIG. 1), which refers to the distance between a buried impurity diffusion region and another buried impurity diffusion region, and the pitch of the word line P2 (see FIG. 1), which refers to the distance between a word line and another word line, are reduced in order to decrease the unit area occupied by each cell.

However, there are the following considerations.

First, in the case of reducing the pitch of the buried impurity diffusion region, a decrease in length of the channel region should be considered. That is, it should be assumed that punch-through margin of a cell transistor is secured even though the pitch of the buried impurity diffusion region is reduced by photolithography. In the case of reducing the pitch of the word line, a decrease in width of the channel region should be considered. That is, even though the pitch of the word line is reduced by photolithography, the decrease in drain current according to a decrease in the width of the channel region should be considered. A decrease in drain current requires another consideration in designing, such as sensing the margin of a bit line. In consideration of the electrical characteristics of a mask ROM, if the punch-through margin of the cell transistor is secured, it is preferable to reduce the pitch of the buried impurity diffusion region, thereby providing many advantages in designing.

FIGS. 3A through 3C are sectional views illustrating a conventional method for forming a buried impurity diffusion region.

After stacking a pad oxide layer 28 and a silicon nitride layer 30 on a semiconductor substrate 26 in sequence, a portion of the silicon nitride layer 30, stacked in an isolation region of a peripheral circuit region (n-channel and p-channel regions), is removed by photolithography using a first photoresist pattern 32 (see FIG. 3A). Then, a field oxide layer 34 is formed in the isolation region by a field oxide step. Here, a cell array region is covered with the silicon nitride layer 30, so that the field oxide layer 28 can not grow (see FIG. 3B).

Consequently, the silicon nitride layer 30 and the pad oxide layer 28 are removed. Then, sacrificial oxidation and ion implantation for controlling threshold voltage, and the step of forming a well 38 are performed. Then, a photoresist is deposited and developed to form a second photoresist pattern 40 for forming a buried impurity diffusion region, and impurities 44 are then implanted using the second photoresist pattern 40 as a mask, thereby forming buried impurity diffusion regions 46 in a cell array region (see FIG. 3C). Here, the second photoresist pattern 40 completely covers the peripheral circuit region and exposures only a region of the cell array region where the buried impurity diffusion regions are to be formed.

In the buried impurity diffusion region 46, which is a region to be a source/drain of a cell transistor, it is important to have the minimum pitch under the current photolithography, and to secure the punch-through margin. To this end, it is important to increase the distance between the buried impurity diffusion regions 46 rather than to increase the size of the buried impurity diffusion region 46 itself.

However, as the design rule is decreased in order to reduce the size of a device, it is not easy to increase the size of a bar (which determines the length of a channel region) of the photoresist pattern 40 for preventing implantation of ions to be larger than a space (which determines the size of the buried impurity diffusion region 46). That is, in the photolithography according to the minimum design rule, the resolution suddenly decreases, thereby leaving an unfavorable photoresist which must be removed. As a result, an over-exposure process is required in order to remove the remaining photoresist. However, the over-exposure process increases a ratio of the space size to the bar size.

Thus, in order to reduce effectively the pitch of the buried impurity diffusion region 46, it is necessary to increase the length of the channel region, i.e., the size of bar, within the minimum pitch of the buried impurity diffusion region, to be larger than the buried impurity diffusion region itself, i.e., the size of space.

SUMMARY OF THE INVENTION

To solve the above problems, it is an object of the present invention to provide a method for fabricating a mask ROM, in which pitch of a buried impurity diffusion region is effectively decreased in order to reduce area of a cell array region.

Accordingly, to achieve the above first object, there is provided a method for fabricating a mask ROM, comprising: stacking a pad oxide layer and a first anti-oxidation layer in sequence in a cell array region and a peripheral circuit region of a semiconductor substrate; partially etching the first anti-oxidation layer to form a first pattern defining an isolation region of a peripheral circuit region and a second pattern defining a buried impurity diffusion region of a cell array region; stacking a second anti-oxidation layer; removing the second anti-oxidation layer stacked in the peripheral circuit region, so that the second anti-oxidation layer stacked in the cell array region remains; forming a field oxide layer in the isolation region of the peripheral circuit region, exposed by the remaining second anti-oxidation layer; implanting impurities to form the buried impurity diffusion region; removing the remaining second anti-oxidation layer and the first anti-oxidation layer; removing the pad oxide layer; performing a sacrificial oxidation process; forming a gate oxide layer; and forming gate electrodes on the gate oxide layer, over all the peripheral circuit region and the cell array region.

Preferably, the pad oxide layer is etched to a thickness, e.g., 50–300 Å, such that the semiconductor substrate is not exposed, and the etching is performed with a positive etch skewness in the cell array region.

Preferably, after the field oxide layer is formed, the second anti-oxidation layer remaining in the cell array region is anisotropically etched to form an anti-oxidation spacer at the side walls of the first and second patterns. In this case, after the buried impurity diffusion region is defined, a protective oxide layer may be formed on the surface of the semiconductor substrate exposed during the anisotropic etching for forming the anti-oxidation spacer.

After the sacrificial oxidation process, the method for fabricating a mask ROM further comprises: forming a buffering oxide layer; performing ion implantation for improving N-field isolation characteristics; performing ion implantation for improving P-field isolation characteristics; performing ion implantation for controlling threshold voltages of transistors formed in the cell array region and the peripheral circuit region; performing ion implantation for forming a well of the peripheral circuit region; and removing the buffering oxide layer.

Thus, in the method for fabricating a mask ROM according to the present invention, when the buried impurity diffusion region is formed to the minimum pitch, the distance between the buried impurity diffusion regions can be increased to be larger than the buried impurity diffusion region itself such that the punch-through margin is easily secured.

BRIEF DESCRIPTION OF THE DRAWINGS

The above object and advantages of the present invention will become more apparent by describing in detail preferred embodiments thereof with reference to the attached drawings in which.

DESCRIPTION OF THE PREFERRED EMBODIMENT

A method for forming a buried impurity diffusion region in a mask ROM according to a preferred embodiment of the present invention will be described with reference to FIGS. 4A through 4L.

Figure 4A:
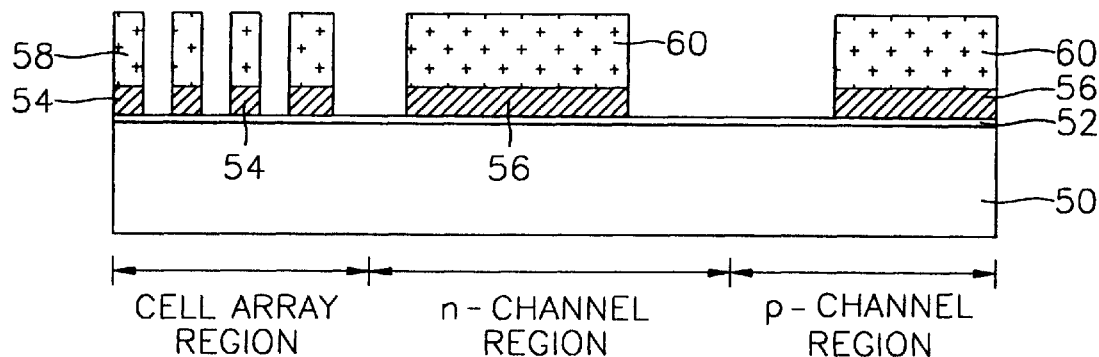
FIGS. 4A through 4L are sectional views illustrating a method for forming a mask ROM having a buried impurity diffusion region according to a preferred embodiment of the present invention.

In detail, FIG. 4A is a sectional view illustrating forming a first pattern 54 for forming a buried impurity diffusion region and a second pattern 56 for forming a field oxide layer. In this step, a pad oxide layer 52 and a first anti-oxidation layer (not shown) to be the first and second patterns 54 and 56 by a subsequent step are stacked in sequence on a semiconductor substrate 50. A sensitive film such as a photoresist is deposited on the first anti-oxidation layer, and the deposited sensitive film is exposed and developed, to form a first sensitive film pattern 58 for forming a buried impurity diffusion region in a cell array region, and a second sensitive film pattern 60 for forming the field oxide layer in a peripheral circuit region (i.e., n-channel and p-channel regions). Then, the first anti-oxidation layer is etched using the first and second sensitive film patterns 58 and 60 as an etching mask, to form the first pattern 54 for forming the buried impurity diffusion region in the cell array region and the second pattern 56 for forming the field oxide layer in the peripheral circuit region.

The pad oxide layer 52 is formed to a thickness of 30~400 Å. The first anti-oxidation layer is formed by depositing an insulation material, e.g., silicon nitride, to a thickness of 1,000~2,000 Å. Here, etching process for forming the first and second patterns 54 and 56 is performed until the thickness of the pad oxide layer 52 becomes 50~300 Å, i.e., the minimum thickness of the remaining pad oxide layer at which the semiconductor substrate 50 is not exposed. Here, the pad oxide layer 52 may be completely removed during the etching process for forming the first and second patterns 54 and 56, exposing the semiconductor substrate 50. However, the pad oxide layer 52 remains to a certain extent in this embodiment, because the exposed surface of the semiconductor substrate may be damaged by a subsequent etching step. which the semiconductor substrate 50 is not exposed. Here, the pad oxide layer 52 may be completely removed during the etching process for forming the first and second patterns 54 and 56, exposing the semiconductor substrate 50. However, the pad oxide layer 52 remains to a certain extent in this embodiment, because the exposed surface of the semiconductor substrate may be damaged by a subsequent etching step.

The first pattern 54 for forming the buried impurity diffusion region and the second pattern 56 for forming the field oxide layer are simultaneously formed by the same photolithography, using the same material layer. Here, the etching process for forming the first and second patterns 54 and 56 is performed such that an etch skewness in the cell array region is to be positive. The positive etch skewness means that the size of the final pattern obtained through the photolithography is larger than a desired size. Such variation in size of the pattern is due to loading effect during the photolithography.

Even though the etching condition in the cell array region is set to be a positive etching skewness, the etching in the peripheral circuit region may be performed to be a negative etching skewness, so that the size of the second pattern 56 for forming the field oxide layer is smaller than a desired size. However, such smaller second pattern 56 in the peripheral circuit region has no problem because the margin of the design rule belongs to that region.

Figure 4B:
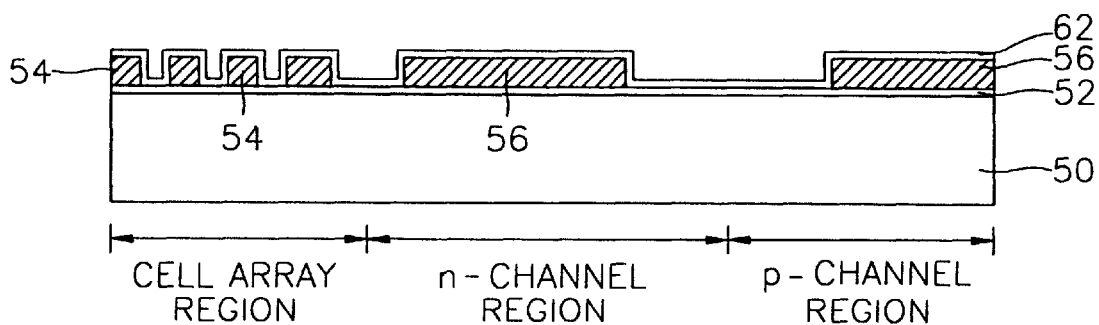

FIG. 4B is a sectional view illustrating the formation of a second anti-oxidation layer 62. The first and second sensitive film patterns 58 and 60 (see FIG. 4A) are removed. Then, an insulation material, e.g., silicon nitride, is deposited on the entire surface of the resultant structure to a thickness, e.g. 50~500 Å, by a method, e.g. low pressure chemical vapor deposition (LPCVD), to form the second anti-oxidation layer 62.

Figure 4C:
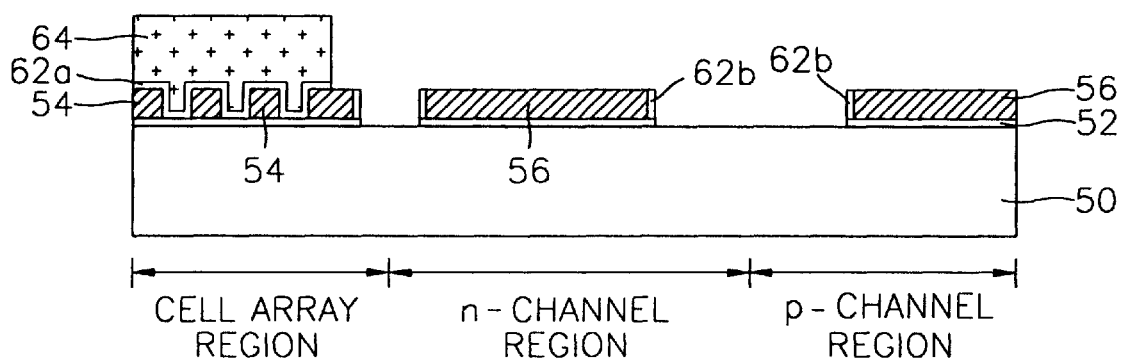

Referring to FIG. 4C, after forming a third sensitive film pattern 64 on the second anti-oxidation layer 62 (see FIG. 4B) to cover only the cell array region, anisotropic etching is performed using the third sensitive film pattern 64 as an etching mask, to remove the second anti-oxidation layer formed in the peripheral circuit region, resulting in a second anti-oxidation layer pattern 62a that covers only the cell array region.

Here, because the anisotropic etching is performed in the step of FIG. 4C, a peripheral spacer 62b may be formed at the sidewalls of the second pattern 56 for forming the field oxide layer.

Figure 4D:
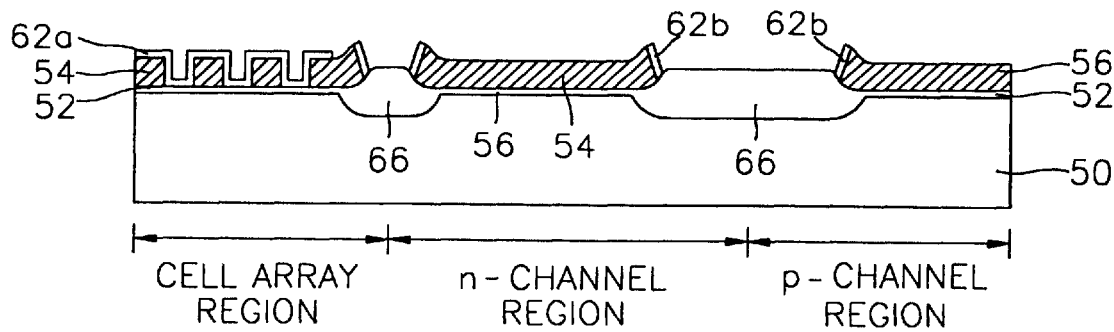

FIG. 4D is a sectional view illustrating the formation of a field oxide layer. The third sensitive film pattern 64 (see FIG. 4C) is removed. Then, the resultant structure is exposed to a condition for oxidation, to form the field oxide layer 66 in an isolation region of the peripheral circuit region.

Here, the cell array region is protected by the second anti-oxidation layer pattern 62a, and a region of the peripheral region other than the isolation region is protected by the second pattern 56 for forming the field oxide layer, so that the field oxide layer 66 is formed only in the isolation region of the peripheral circuit region.

Figure 4E:
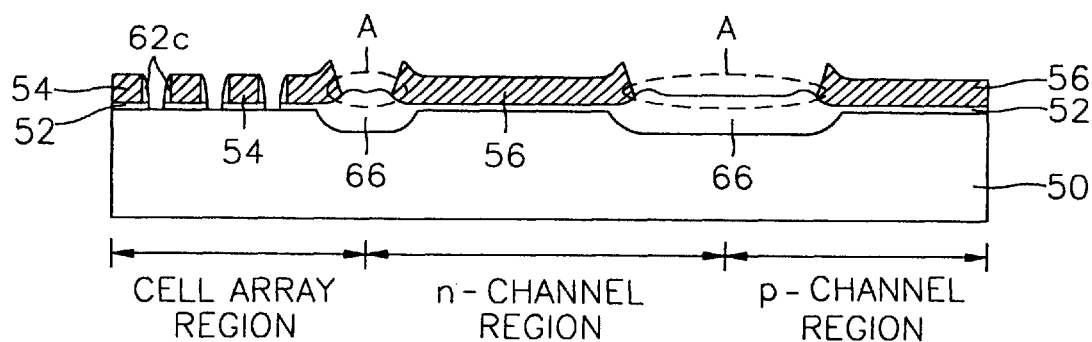

Referring to FIG. 4E, the second anti-oxidation layer pattern 62a is anisotropically etched to form an anti-oxidation spacer 62c at the sidewalls of the first pattern 54 for forming the buried impurity diffusion region. Here, the second anti-oxidation layer pattern 62a is over-etched to expose the semiconductor substrate 50, which is for cell uniformity. By the over-etching, the field oxide layer 66 formed in the peripheral circuit region is etched by a predetermined thickness "A". However, it does not matter because the field oxide layer 66 is thick enough to prevent damage due to over-etching.

Figure 4F:
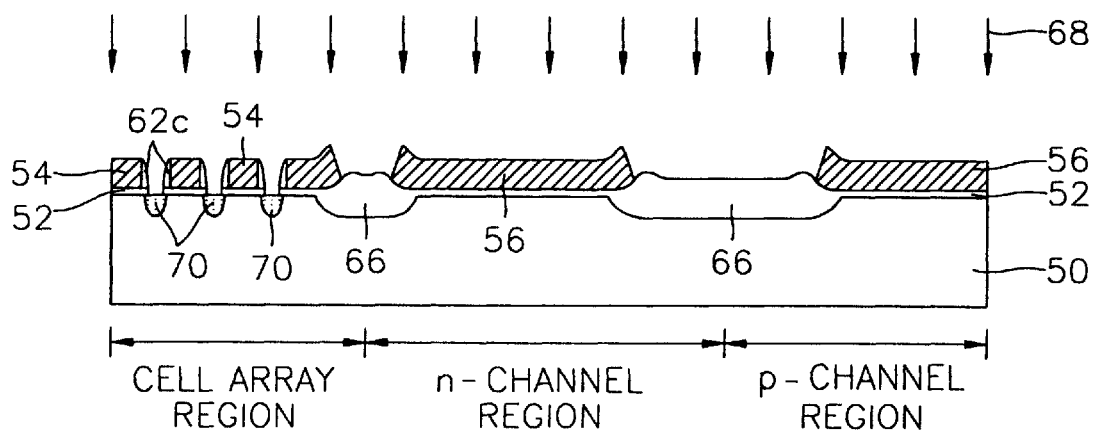

Referring to FIG. 4F, n-type impurities, e.g. arsenic (As) ions 68, are implanted into the entire surface of the resultant structure having the anti-oxidation spacer 62c, to form a buried impurity diffusion region 70 near the surface of the semiconductor substrate 50 exposed between the first patterns 54 for forming the buried impurity diffusion region 70.

Here, the impurity ions 68 are not implanted into a region covered by the anti-oxidation spacer 62c, i.e., neighboring regions of the first pattern 54, so that the width of the buried impurity diffusion region 70 is half the width of the anti-oxidation spacer 62c, in comparison to the case where the anti-oxidation spacer is not formed.

Figure 1:
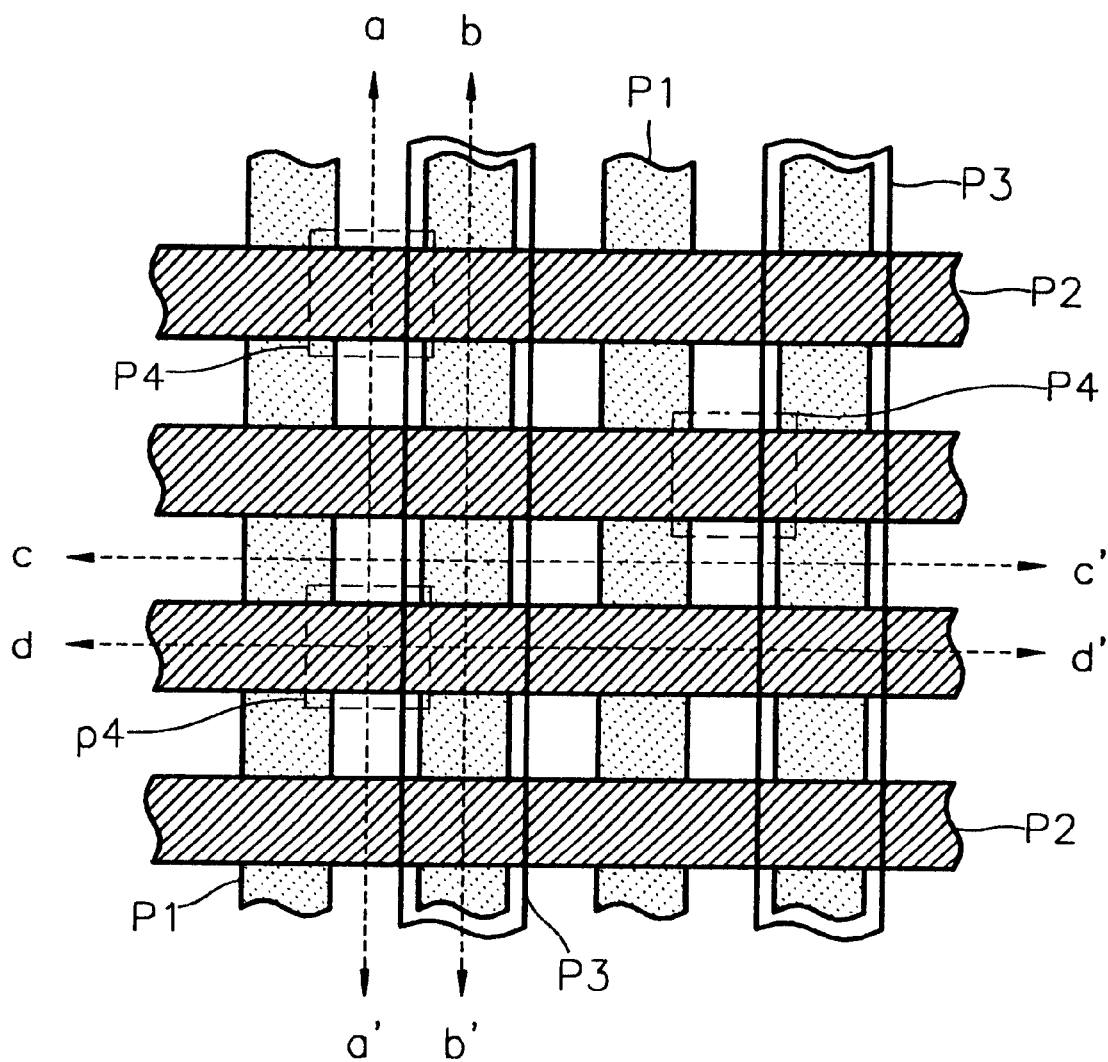
FIG. 1 is a plan view of a cell array region of a NOR type mask ROM.
Figure 2A:
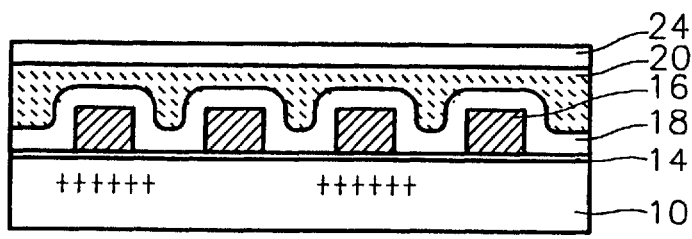
FIGS. 2A through 2D are sectional views cut long lines a—a', b—b', c—c' and d—d' of FIG. 1.
Figure 2B:
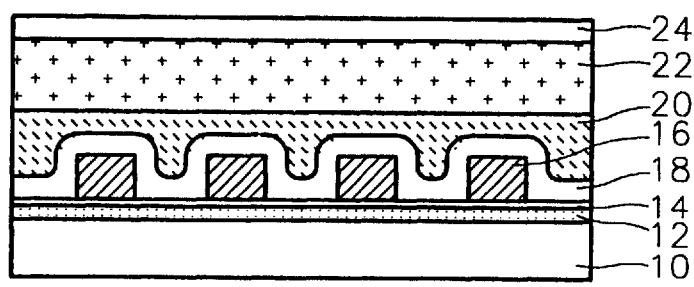
Figure 2C:
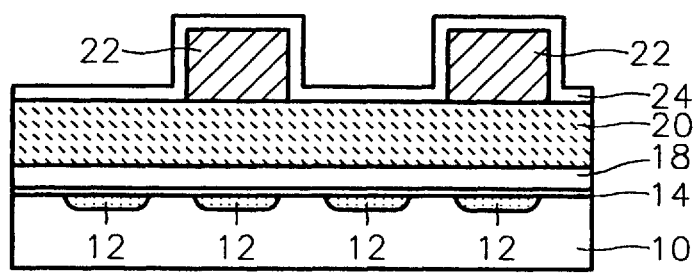
Figure 2D:
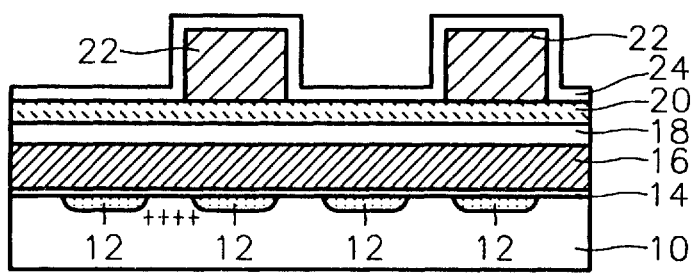
Figure 3A:
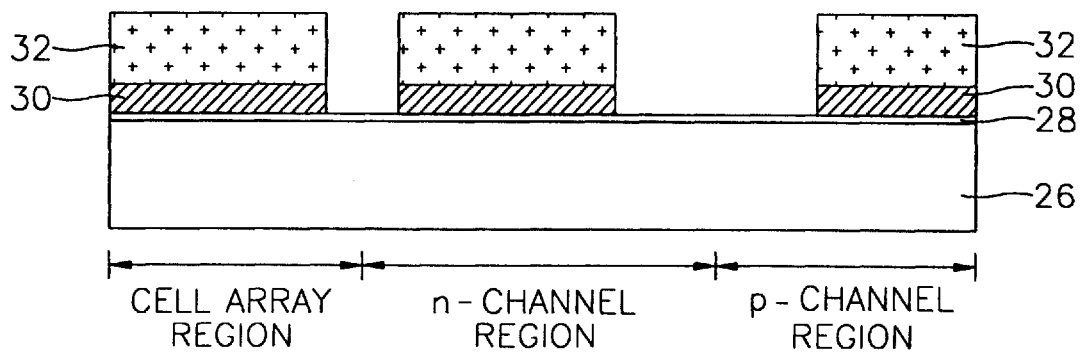
FIGS. 3A through 3C are sectional views illustrating a conventional method for forming a buried inopurity diffusion region.
Figure 3B:
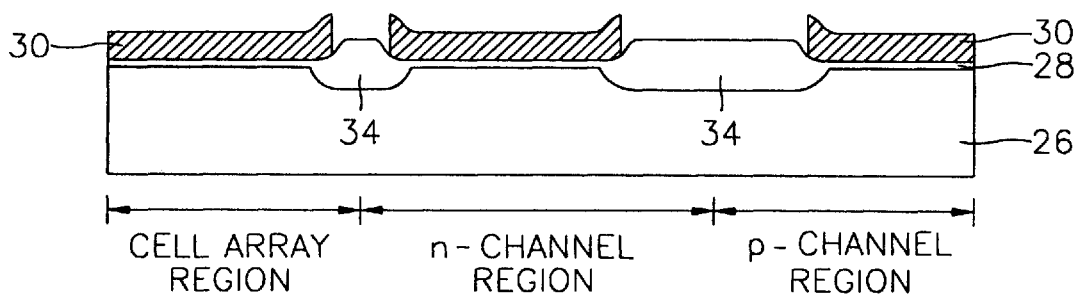
Figure 3C:
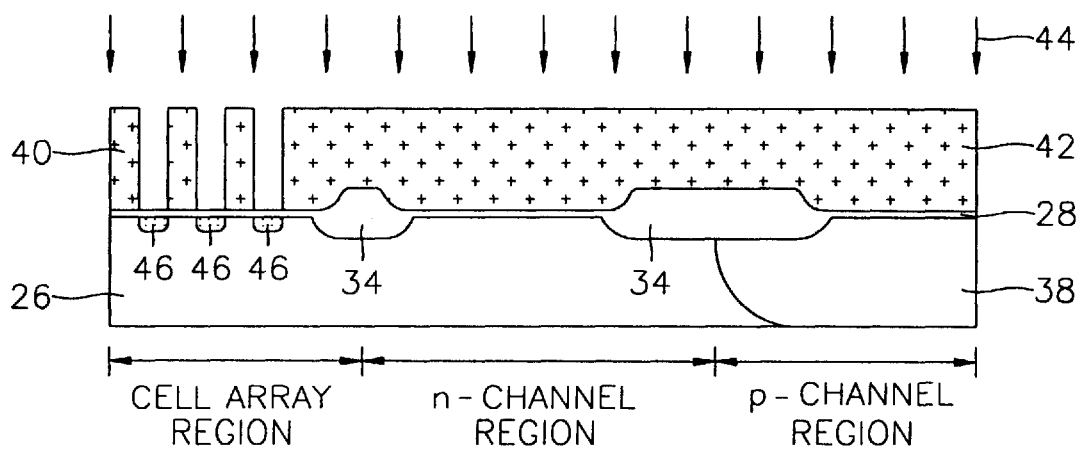

According to the preferred embodiment of the present invention, the first pattern 54 for forming the buried impurity diffusion region is etched with a positive etch skewness, and the anti-oxidation spacer 62c is formed at the sidewalls of the first pattern 54 for forming the buried impurity diffusion region, so that a ratio of the distance between the buried impurity diffusion regions 70 to the width of the buried impurity diffusion region 70 itself is increased to be larger than in the conventional method illustrated with reference to FIGS. 3A through 3C even though the photolithography is performed with the minimum design rule.

Figure 4G:
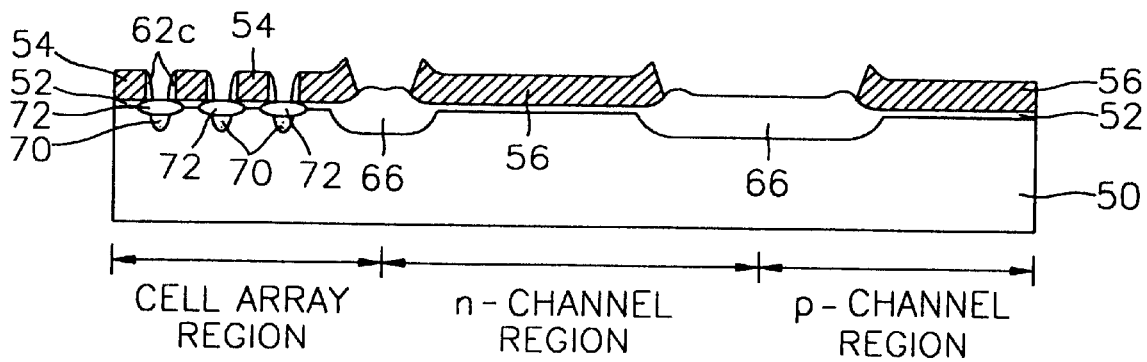

Referring to FIG. 4G, a protective oxide layer 72 is formed by oxidizing the surface of the buried impurity diffusion region 70. Here, the protective oxide layer 72 is grown to a thickness, e.g., 50~500 Å. The process for forming the protective oxide layer 72 activates impurities implanted into the buried impurity diffusion region 70, and cures the surface damage of the semiconductor substrate 50 and the field oxide layer 66, such damage occurring when the anti-oxidation spacer 62c is formed.

Figure 4H:
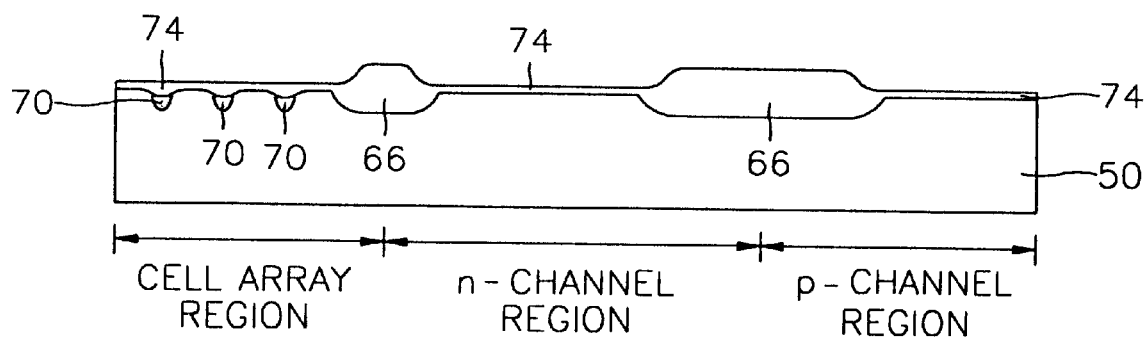

Referring to FIG. 4H, the first pattern 54 (see FIG. 4G) for forming the buried impurity diffusion region 70, the second pattern 56 (see FIG. 4G) for forming the field oxide layer, and the anti-oxidation spacer 62c (see FIG. 4G) are removed. Here, the protective oxide layer 72 prevents damage to the surface of the buried impurity diffusion region 70 by an etchant, e.g. phosphoric acid ($H_3PO_4$), for wet etching in the step of FIG. 4H. That is, when the impurities are implanted to form the buried impurity diffusion region 70, the surfaces of the semiconductor substrate 50 and the field oxide layer 66 are damaged by impurities implanted with a high implantation energy. If the wet etching is performed while such damage exists, the damaged surface is easily etched in comparison with the other portion.

After the wet etching, the protective oxide layer 72 is removed, and then a buffering oxide layer 74 is formed on the entire surface of the resultant structure. The buffering oxide layer 74 is for preventing damage to the surface of the semiconductor substrate 50 during subsequent impurity ion implantation.

Figure 4I:
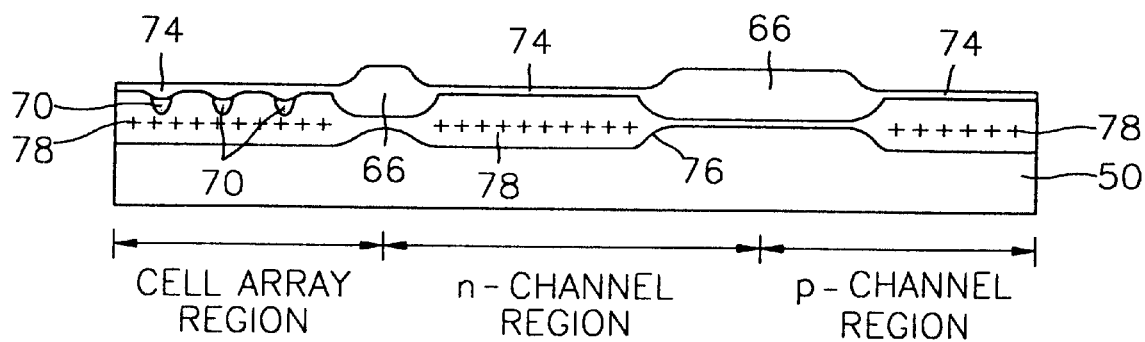

Referring to FIG. 4I, an n-channel stop layer 76 for improving electrical isolation characteristics of an n-channel field where an n-channel region is formed and a diffusion layer 78 for controlling the threshold voltage of the n-channel region are formed by a general process.

Figure 4J:
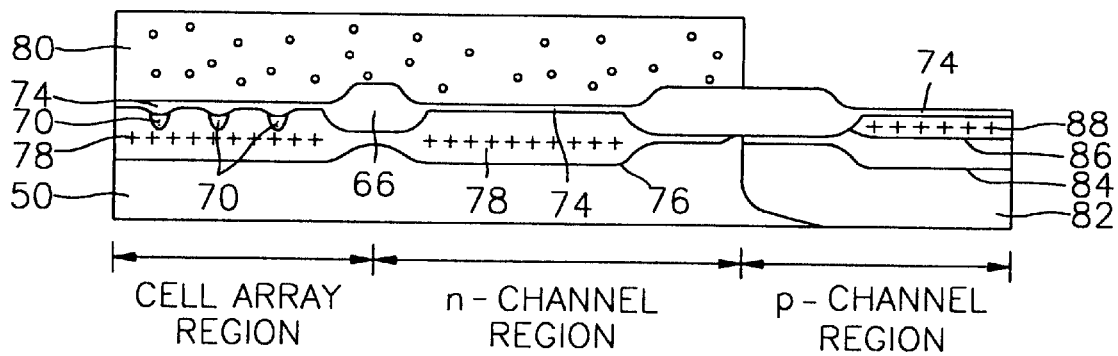

Referring to FIG. 4J, after forming a fourth sensitive film pattern 80 which covers the cell array region and the n-channel region, ions are implanted to form an n-well 82, and a p-channel stop layer 84 for improving electrical isolation characteristics of a p-channel field where a p-channel region is formed, and a diffusion layer 88 for controlling the threshold voltage of the p-channel region are formed. The reference numeral "86" represents a barrier ion implantation layer for preventing a p-channel punch-through phenomenon.

Figure 4K:
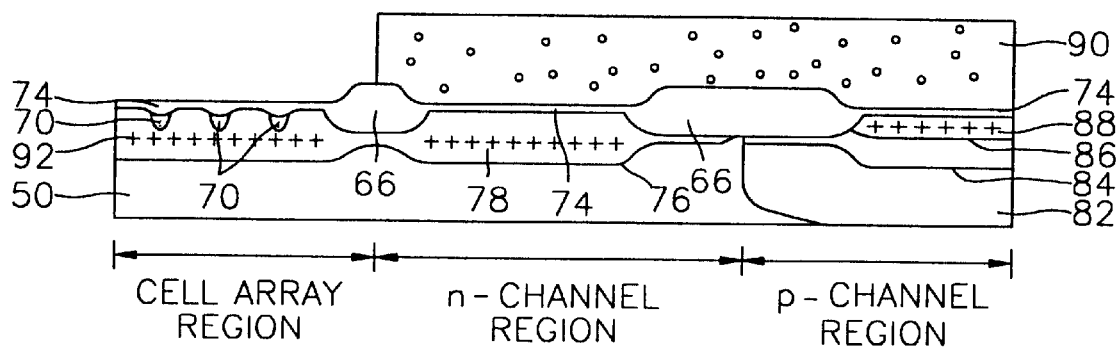

Referring to FIG. 4K, after forming a fifth sensitive film pattern 90 covering the n-channel and p-channel regions, a diffusion layer 92 for controlling the threshold voltage of the cell array region is formed. Here, each step illustrated with reference to FIGS. 4I, 4J and 4K may be performed in reverse order.

Figure 4L:
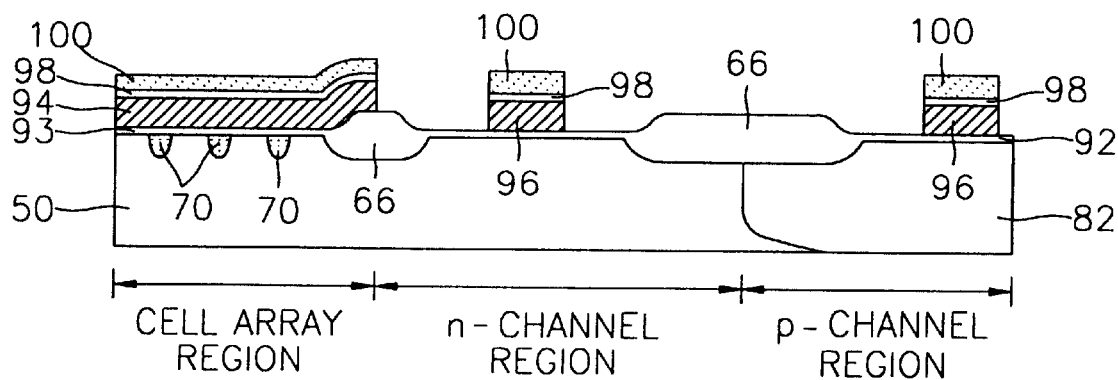

Referring to FIG. 4L, after sacrificial oxidation, a gate oxide layer 93 is formed on the entire surface of the end resultant, and an impurity-doped polysilicon layer, a silicide layer and a anti-reflection layer 100 are staked in sequence on the gate oxide layer 93, and then patterned to form a word line including the polysilicon layer 94 and the silicide layer 98 in the cell array region, and a gate electrode including the polysilicon layer 96 and the silicide layer 98 in the peripheral circuit region. Then, general steps, e. g., the step of forming a source and a drain of a peripheral circuit region, and the step of performing metal interconnection, are performed, explanation of those steps is omitted.

Figure 5A:
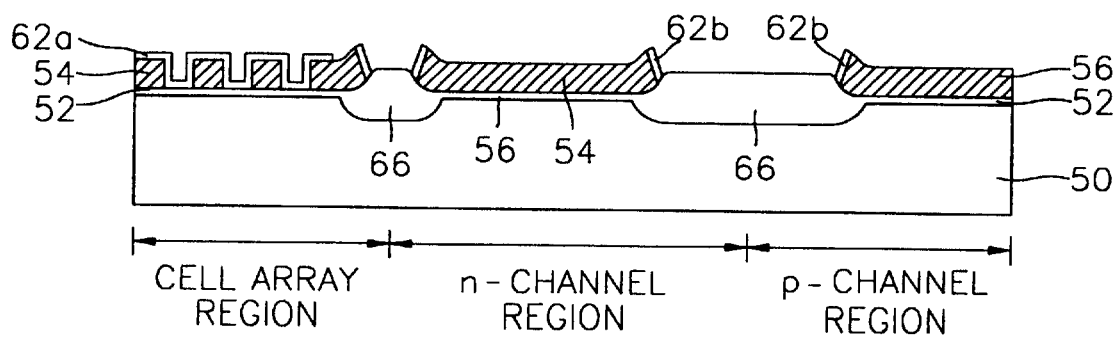
FIGS. 5A and 5B are sectional views illustrating a method for forming a mask ROM having a puried impurity diffusion region according to another preferred embodiment of the present invention.
Figure 5B:
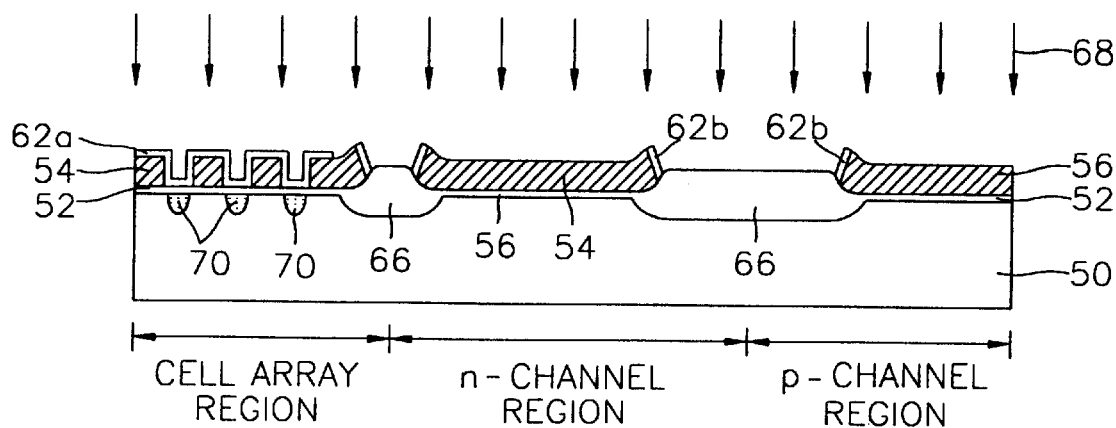

FIGS. 5A and 5B are sectional views illustrating a method for forming a buried impurity diffusion region in a mask ROM according to another embodiment of the present invention. FIG. 5A is the same as FIG. 4D.

According to the above first embodiment of the present invention, impurity ion implantation is performed after the anti-oxidation spacer 62c is formed at the sidewalls of the first pattern 54 for forming the buried impurity diffusion region by anisotropically etching the second anti-oxidation layer pattern 62b. However, in this embodiment, impurities 68 are implanted only when the anti-oxidation spacer 62c is not formed, that is, while the second anti-oxidation layer pattern 62b is formed.

Preferably, the level of impurity ion implantation energy for forming the buried impurity diffusion region is enough for penetrating the second anti-oxidation layer pattern 62b.

Also, in the method for forming the buried impurity diffusion region according to the present invention, a conventional problem of mis-alignment between the buried impurity diffusion region and a metal contact, and between the buried impurity diffusion region and a cell coding pattern, can be quite improved, in addition to punch-through margin of the cell transistor being secured.

In detail, the pattern for forming the field oxide layer and the pattern for forming the buried impurity diffusion layer are formed using the same mask in the present invention. Thus, the problem of mis-alignment in a conventional method in which the two patterns are formed in different steps can be solved.

According to the conventional method, a buried impurity diffusion region as a critical layer within the cell array region is formed by ion implantation, so that an alignment key capable of correcting alignment accuracy can not be formed. Thus, alternatively an active key which is formed in the step for forming a field oxide layer is used as the alignment key. However, if the active key is used as an alignment key, alignment accuracy of the word line to the buried impurity diffusion region as the critical layer within the cell array region, and that of the metal contact to the buried impurity diffusion region are not acceptable even though the alignment accuracy of the buried impurity diffusion region, the word line and the metal contact to the active key are satisfactory. In other words, in the case of using the active key, assuming that the buried impurity diffusion region is shifted by −0.05 μm and the metal contact is shifted by +0.05 μm with respect to the active key, so that mis-alignment occurs, the mis-alignment between the metal contact and the buried impurity diffusion region becomes 0.1 μm, which is over the limit of the mis-alignment.

Even though the limit of mis-alignment is satisfactory in each step, i.e., less than 0.05 μm, it is not possible to form the alignment key in the case of forming the buried impurity diffusion region by ion implantation.

However, according to the present invention, the active step of forming the field oxide layer and the step of forming the buried impurity diffusion region can be performed using the same mask, the degree of mis-alignment of a word line, a metal contact and a cell code to the buried impurity diffusion region can be markedly improved.

Thus, in the method for fabricating a mask ROM according to the present invention, the distance between the buried impurity diffusion regions within the minimum pitch of the impurity diffusion region can be larger than the width of buried impurity diffusion region itself, so that it is easy to ensure a punch-through margin. Also, the degree of mis-alignment between each constituent element can be reduced, improving electrical characteristics of a device.

While the present invention has been illustrated and described with reference to specific embodiments, further modifications and alterations within the spirit and scope of this invention will occur to those skilled in the art.

What is claimed is:

1. method for fabricating a mask ROM, comprising:

stacking a pad oxide layer and a first anti-oxidation layer in sequence in a cell array region and a peripheral circuit region of a semiconductor substrate;

partially etching the first anti-oxidation layer to form a first pattern defining a buried impurity diffusion region of the cell array region and a second pattern defining an isolation region of the peripheral circuit region;

stacking a second anti-oxidation layer;

removing the second anti-oxidation layer stacked in the peripheral circuit region, so that the second anti-oxidation layer stacked in the cell array region remains;

forming a field oxide layer in the isolation region of the peripheral circuit region, exposed by the remaining second anti-oxidation layer; and implanting impurities to form the buried impurity diffusion region.

2. The method of claim 1, wherein in the partial etching of the anti-oxidation layer, the pad oxide layer is etched to a thickness such that the semiconductor substrate is not exposed.

3. The method of claim 2, wherein the pad oxide layer is etched such that the thickness of the remaining pad oxide layer is about 50~300 Å.

4. The method of claim 1, wherein in the partial etching of the anti-oxidation layer, the etching is performed with a positive etch skewness in the cell array region.

5. The method of claim 1, further comprising anisotropically etching the second anti-oxidation layer remaining in the cell array region, to form an anti-oxidation spacer at the side walls of the first and second patterns.

6. The method of claim 5, further comprising forming a protective oxide layer on the surface of the semiconductor substrate exposed during the anisotropic etching for forming the anti-oxidation spacer.

7. The method of claim 1, wherein the first anti-oxidation layer and the second anti-oxidation layer are formed of silicon nitride.

8. The method of claim 5, wherein the first anti-oxidation layer is formed to a thickness of about 1,000~2,000 Å, and the second anti-oxidation layer is formed to a thickness of about 100~500 Å.

9. The method of claim 1, wherein the impurities implanted have an implantation energy capable of penetrating the second anti-oxidation layer remained in the cell array region.

10. The method of claim 1, further comprising:

removing the remaining second anti-oxidation layer and the first anti-oxidation layer;

removing the pad oxide layer;

performing a sacrificial oxidation process;

forming a gate oxide layer; and forming gate electrodes on the gate oxide layer, over all the peripheral circuit region and the cell array region.

11. A method for fabricating a mask ROM, comprising:

stacking a pad oxide layer and a first anti-oxidation layer in sequence in a cell array region and a peripheral circuit region of a semiconductor substrate;

partially etching the first anti-oxidation layer to form a first pattern defining a buried impurity diffusion region of the cell array region and a second pattern defining an isolation region of the peripheral circuit region;

stacking a second anti-oxidation layer;

removing the second anti-oxidation layer stacked in the peripheral circuit region, so that the second anti-oxidation layer stacked in the cell array region remains;

forming a field oxide layer in the isolation region of the peripheral circuit region, exposed by the remaining second anti-oxidation layer;

anisotropically etching the remaining second anti-oxidation layer to form an anti-oxidation spacer at the side walls of the first and second patterns;

implanting impurities to form the buried impurity diffusion region in the cell array region;

forming a protective oxide layer on the surface of the buried impurity diffusion region;

removing the anti-oxidation spacer and the first anti-oxidation layer;

removing the pad oxide layer and the protective oxidation layer;

performing a sacrificial oxidation process;

forming a gate oxide layer; and forming gate electrodes over all the cell array region and the peripheral circuit region.

12. The method of claim 11, wherein in the partial etching of the first anti-oxidation layer, the pad oxide layer is etched to a thickness such that the semiconductor substrate is not exposed.

13. The method of claim 12, wherein the pad oxide layer is etched such that the thickness of the remaining pad oxide layer is about 50~300 Å.

14. The method of claim 11, wherein in the partial etching of the anti-oxidation layer, the etching is performed with a positive etch skewness in the cell array region.

15. The method of claim 11, wherein the first anti-oxidation layer and the second anti-oxidation layer are formed of silicon nitride.

16. The method of claim 15, wherein the first anti-oxidation layer is formed to a thickness of about 1,000~2,000 Å, and the second anti-oxidation layer is formed to a thickness of about 100~500 Å.

17. The method of claim 11, further comprising:

forming a buffering oxide layer;

performing ion implantation for improving N-field isolation characteristics;

performing ion implantation for improving P-field isolation characteristics;

performing ion implantation for controlling threshold voltages of transistors formed in the cell array region and the peripheral circuit region;

performing ion implantation for forming a well of the peripheral circuit region; and removing the buffering oxide layer.

* * * * *

UNITED STATES PATENT AND TRADEMARK OFFICE
CERTIFICATE OF CORRECTION

PATENT NO. : 6,291,308 B1
DATED : September 18, 2001
INVENTOR(S) : Lee et al.

It is certified that error appears in the above-identified patent and that said Letters Patent is hereby corrected as shown below:

Column 2,
Line 14, after "connection.," delete "in" and insert therefor -- In --

Column 4,
Line 62, after "buried" delete "inopurity" and insert therefor -- impurity --

Column 5,
Line 2, after "having a" delete "puried" and insert therefor -- buried --
Line 45, after "etching step." delete "which the semiconductor substrate 50 is not exposed. Here, the pad oxide layer 52 may be completely removed during the etching process for forming the first and second patterns 54 and 56, exposing the semiconductor substrate 50. However, the pad oxide layer 52 remains to a certain extent in this embodiment, because the exposed surface of the semiconductor substrate may be damaged by a subsequent etching step."

Column 7,
Line 28, after "portion." insert therefor -- In the above emobidment of the present invention, after forming the buried impurity diffusion region 70, such damage at the surface is cured during the oxidation for forming the protection oxide layer 72, so that loss of the semiconductor substrate 50 and the field oxide layer by the wet etching can be minimized. --

Signed and Sealed this

Third Day of May, 2005

JON W. DUDAS
*Director of the United States Patent and Trademark Office*